United States Patent
Chen et al.

(10) Patent No.: US 8,237,297 B2
(45) Date of Patent: Aug. 7, 2012

(54) SYSTEM AND METHOD FOR PROVIDING ALIGNMENT MARK FOR HIGH-K METAL GATE PROCESS

(75) Inventors: Kuei Shun Chen, Hsin-Chu (TW); Meng-Wei Chen, Taichung (TW); George Liu, Shin-Chu (TW); Jiann Yuan Huang, Hsinchu (TW); Chia-Ching Lin, Taichung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 99 days.

(21) Appl. No.: 12/835,415

(22) Filed: Jul. 13, 2010

(65) Prior Publication Data

US 2011/0241119 A1  Oct. 6, 2011

Related U.S. Application Data

(60) Provisional application No. 61/321,240, filed on Apr. 6, 2010.

(51) Int. Cl.
*H01L 23/544* (2006.01)

(52) U.S. Cl. .................. 257/797; 257/E23.179; 438/401
(58) Field of Classification Search .................. 257/797, 257/E23.179; 438/401
See application file for complete search history.

(56) References Cited

U.S. PATENT DOCUMENTS

| | | | | |
|---|---|---|---|---|
| 5,889,335 | A * | 3/1999 | Kuroi et al. | 257/797 |
| 6,798,038 | B2 * | 9/2004 | Sato et al. | 257/510 |
| 6,939,777 | B2 * | 9/2005 | Ohto et al. | 438/401 |
| 7,419,882 | B2 | 9/2008 | Wu et al. | |
| 7,566,516 | B2 | 7/2009 | Yang | |

* cited by examiner

*Primary Examiner* — Trung Q Dang
(74) *Attorney, Agent, or Firm* — Haynes and Boone, LLP

(57) ABSTRACT

The alignment mark and method for making the same are described. In one embodiment, a semiconductor structure includes a substrate having a device region and an alignment region; a first shallow trench isolation (STI) feature in the alignment region and having a first depth D1; a second STI feature in the device region and having a second depth D2; an alignment mark with patterned features overlying the first STI in the alignment region; and a gate stack formed on an active region in the device region.

20 Claims, 6 Drawing Sheets

SYSTEM AND METHOD FOR PROVIDING ALIGNMENT MARK FOR HIGH-K METAL GATE PROCESS

PRIORITY DATA

This application claims priority to Provisional Application Ser. No. 61/321,240 filed on Apr. 6, 2010, the entire disclosure of which is incorporated herein by reference.

TECHNICAL FIELD

The present disclosure relates generally to alignment marks for lithographic processes and, more particularly, to system and method for an improved alignment mark for high-k metal gate processes.

BACKGROUND

Alignment marks are important in fabrication of semiconductor, or integrated circuit ("IC"), devices because the devices are produced by aligning several layers of conductive, semiconductive, and insulative materials one atop the other with reference to the alignment marks. It is critical that each layer is precisely aligned with the previous layer so that the resultant circuits are functional and reliable. Typically, aligning a layer with a previous one is accomplished using a wafer stepper, which is used to optically project a circuit pattern on a mask mounted therein onto a layer of the wafer disposed on a wafer chuck of the stepper. Before the mask pattern is transferred, the wafer must first be precisely aligned with the mask. Once such alignment is achieved, the remaining steps of projecting the mask pattern on to the semiconductor may be performed.

During the alignment phase, the position of the alignment mark on the wafer is typically sensed using a laser beam, which is bounced off the alignment mark to produce a reflective light signal. This reflective light is reflected back to an inspector of the stepper, which analyzes it to determine the exact position of the alignment mark. Notably, the quality of the signal reflected from the alignment mark is directly dependent on the reliability and integrity of the structure thereof. Alignment marks fabricated using existing technologies often times do not lead to a strong reflected signal, which makes accurate alignment more difficult.

Therefore, while existing methods of forming alignment marks have been generally adequate for their intended purposes, they have not been entirely satisfactory in every aspect.

SUMMARY

One embodiment is a semiconductor structure including a substrate having a device region and an alignment region; a first shallow trench isolation (STI) feature in the alignment region and having a first depth D1; a second STI feature in the device region and having a second depth D2; an alignment mark with patterned features overlying the first STI in the alignment region; and a gate stack formed on an active region in the device region.

Another embodiment is a semiconductor structure including a substrate having a device region and an alignment region; a first feature having a first depth D1 in the alignment region; a second feature in the device region and having a second depth D2, wherein the first and second features are formed the substrate; and a third feature overlying the first feature, configured as an alignment mark, and formed in a material layer on the substrate.

The present disclosure also provides a method in another embodiment. The method includes forming, on a semiconductor substrate, a patterned material layer having a first opening in a first region and a second opening in a second region, wherein the first opening has a first width W1 and the second opening has a second width W2 different from W1; performing an etch process to the semiconductor substrate through the openings of the patterned material layer, resulting a first trench of a first depth D1 in the first region and a second trench of a second depth D2 in the second region; filling a dielectric material in the first and second trenches to form a first STI in the first region and a second STI in the second region; and patterning a conductive material layer, resulting an alignment mark on the first STI and a gate stack on an active region of the second region.

BRIEF DESCRIPTION OF THE DRAWINGS

The present disclosure is best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

The present disclosure relates generally to alignment marks for lithographic processes and, more particularly, to system and method for an improved alignment mark for high-k metal gate lithography processes. It is understood, however, that specific embodiments are provided as examples to teach the broader inventive concept, and one of ordinary skill in the art can easily apply the teachings of the present disclosure to other methods and systems. Also, it is understood that the methods and systems discussed in the present disclosure include some conventional structures and/or steps. Since these structures and steps are well known in the art, they will only be discussed in a general level of detail. Furthermore, reference numbers are repeated throughout the drawings for the sake of convenience and example, and such repetition does not indicate any required combination of features or steps throughout the drawings.

Figure 1A:
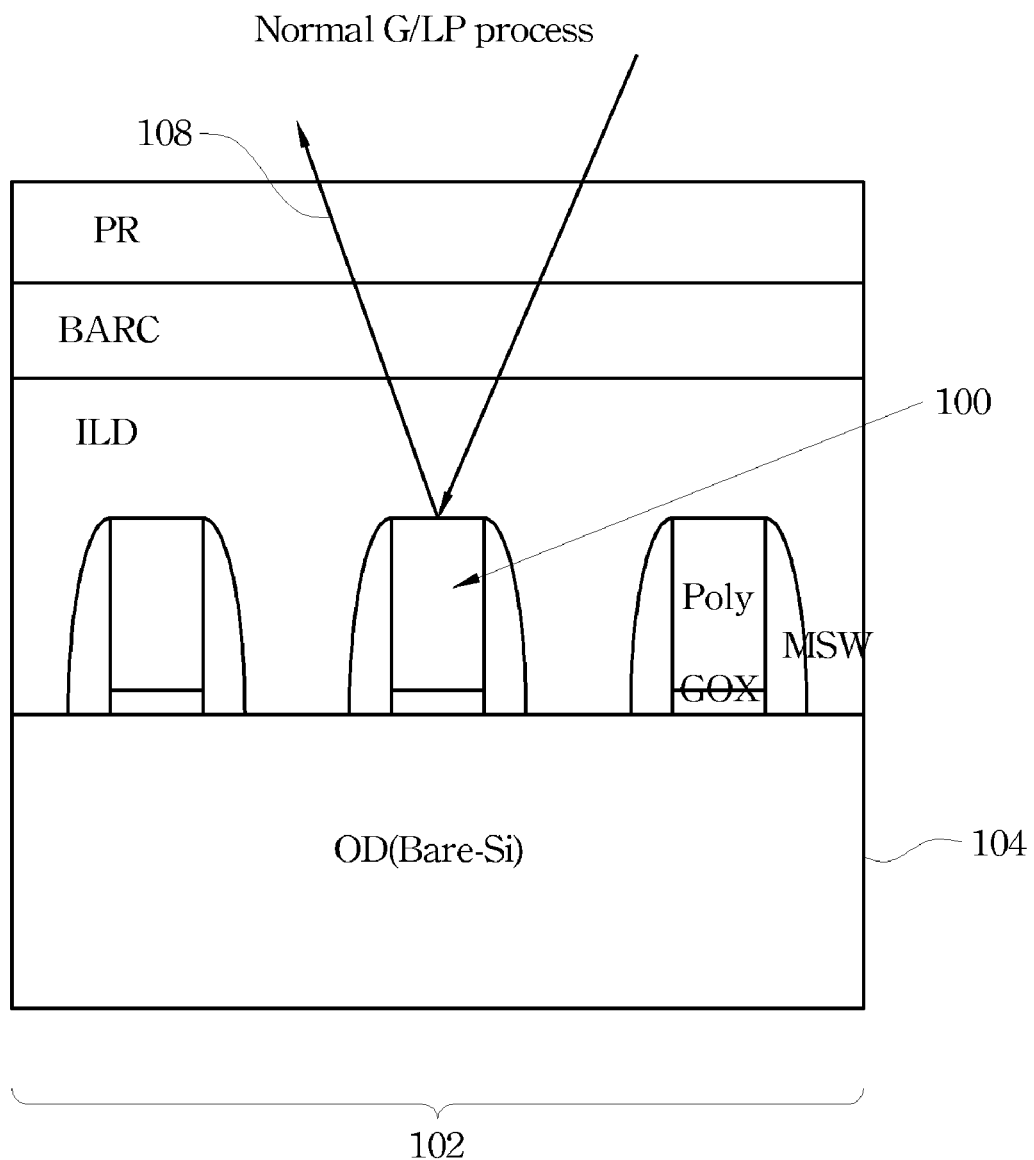
FIGS. 1A and 1B illustrate prior art alignment structures and methods.

As previously noted, throughout fabrication of an IC using photolithography processes, it is necessary to properly align a mask containing a pattern to be transferred to the wafer, or a field of the wafer, with a previous pattern on the wafer before transferring the mask pattern. As illustrated in FIG. 1A, in certain prior art embodiments, alignment of mask comprising a contact layer pattern may be accomplished by providing an alignment mark comprising a polysilicon gate ("poly gate") feature, designated by a reference numeral 100, in an alignment area 102 of a portion of a wafer 104. This technique is problematic due to unsuitable poly gate feature height in a replace poly gate ("RPG") process, which does not provide highly-controllable contact layer-to-poly gate layer overlay performance. Additionally, if there is a change to the poly gate alignment mark 100, the strength of an alignment signal, defined for purposes of FIG. 1A as the signal reflected from the alignment mark and designated by a reference numeral 108, which signal is not tunable, may be weak and insufficient for production purposes.

Figure 1B:
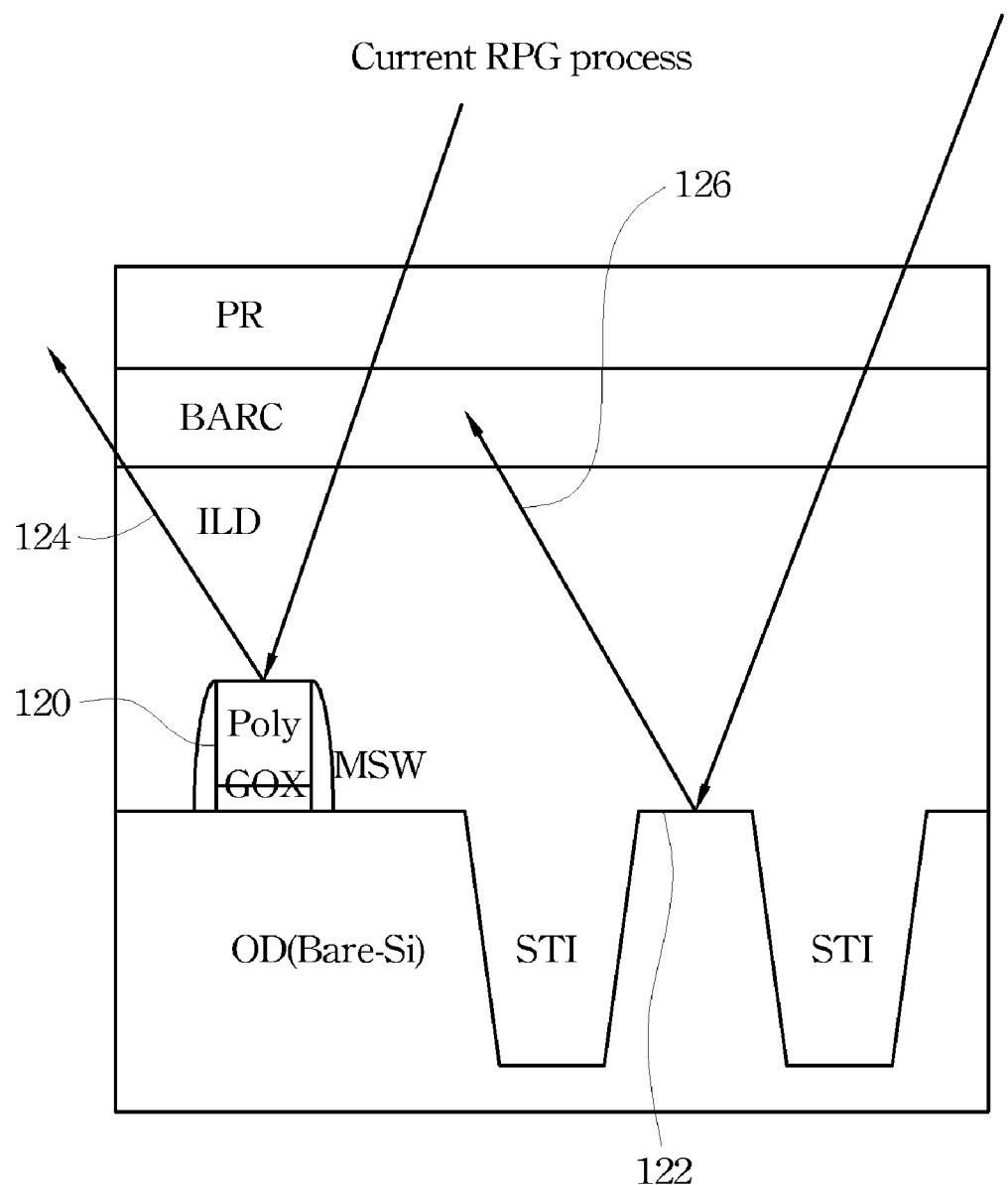

Alternatively, as illustrated in FIG. 1B, an alignment structure may comprise two features, including a first feature 120 and a second feature 122, in which case the alignment signal comprises the interference between a first reflective light 124 and a second reflective light 126 reflected off the first and second alignment features 120, 122, respectively. As with the embodiment illustrated in FIG. 1A, the reflective lights 124, 126, are analyzed by the inspector to determine the position of the alignment mark structure. The embodiment shown in FIG. 1B suffers deficiencies similar to that of the embodiment shown in FIG. 1A, as the alignment signal is related to the thickness, or height ("H"), of the poly gate feature 120 or distance between the first and second reflective lights 124, 126. The poly gate feature height is fixed by the IC design. Thus, free and independent tuning of the poly gate feature height may be difficult.

In accordance with features of embodiments described herein, structure and method are provided for providing an enhanced and tunable alignment signal for use in lithography processes, thereby providing better overlay and alignment control. As will be described herein, one embodiment is implemented in association with three pattern layers, referred to as L1, L2, and L3. In one example, described herein, the layers L1, L2, and L3 comprise, respectively a shallow trench isolation ("STI") layer, a poly gate layer, and a contact layer. It will be recognized, however, that the layers can be any three consecutive layers in a set of layers comprising STI, poly gate, contact, M1, M2, M3, etc. The signal used to align the mask for L3 (the "L3 alignment signal" or "alignment signal") to L2 is defined as the signal reflected from the alignment structure and received by an inspector and comprises the interference between a first reflective light from an L2 alignment feature and a second reflective light from an L1 feature. The strength of alignment signal will be maximized if the interference between the first and second reflective lights is constructive.

Figure 2:
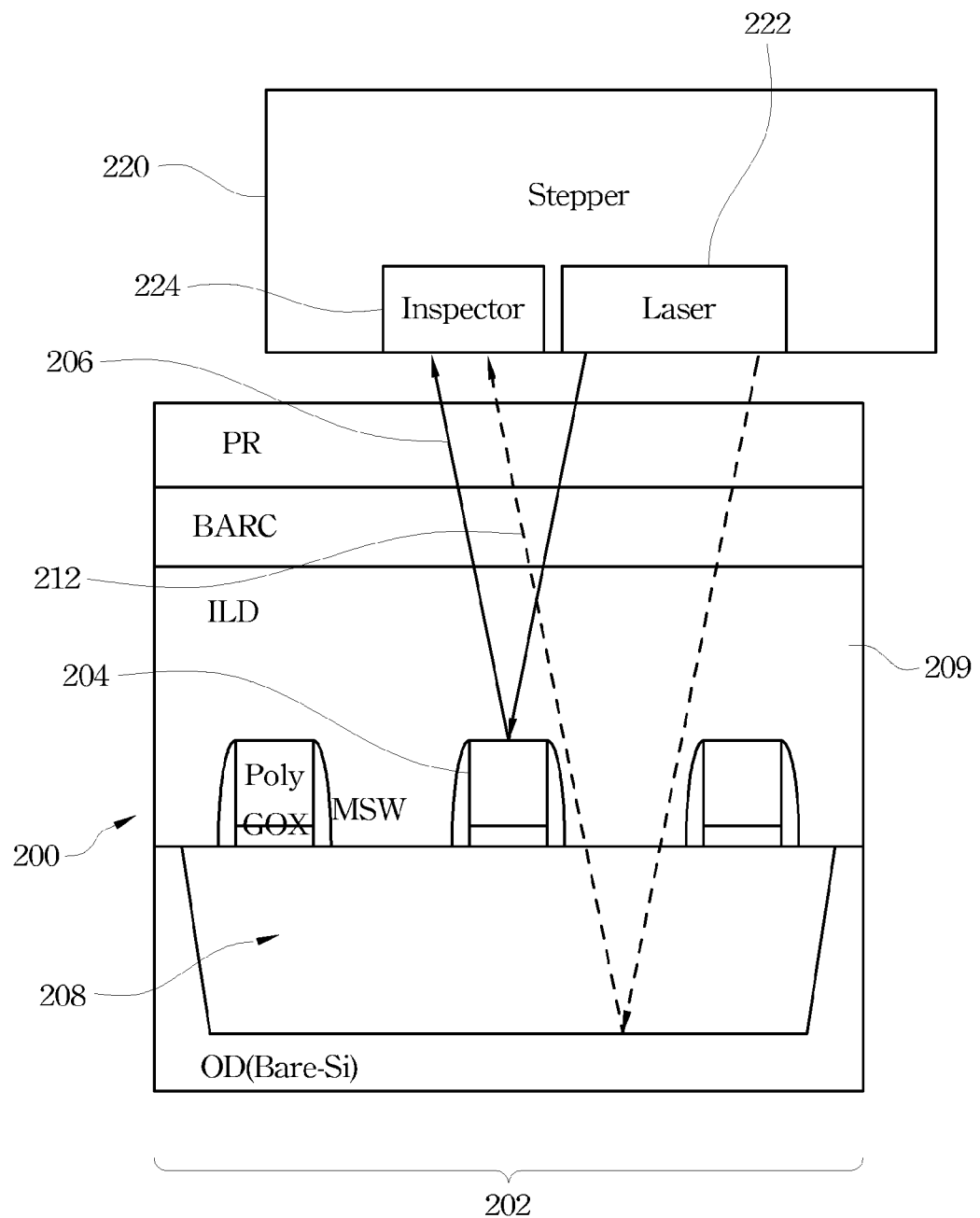
FIG. 2 illustrates an alignment structure and method in accordance with one embodiment.

In one embodiment, as illustrated in FIG. 2, a portion of a wafer 200 comprises an alignment area 202. A poly gate feature 204 in L2 in the alignment area 202 forms an alignment mark for generating a first reflective light, designated in FIG. 2 by a reference numeral 206. An STI feature 208 in layer L1 forms a second alignment feature, wherein a bottom surface of the STI feature 208 is used to generate the second reflective light, designated in FIG. 2 by a reference numeral 212. The STI pattern in L1 is tuned such that the STI feature 208 has the appropriate depth D such that the first and second reflective lights 206, 212, respectively, constructively interfere with each other to create an alignment signal.

Figure 3:
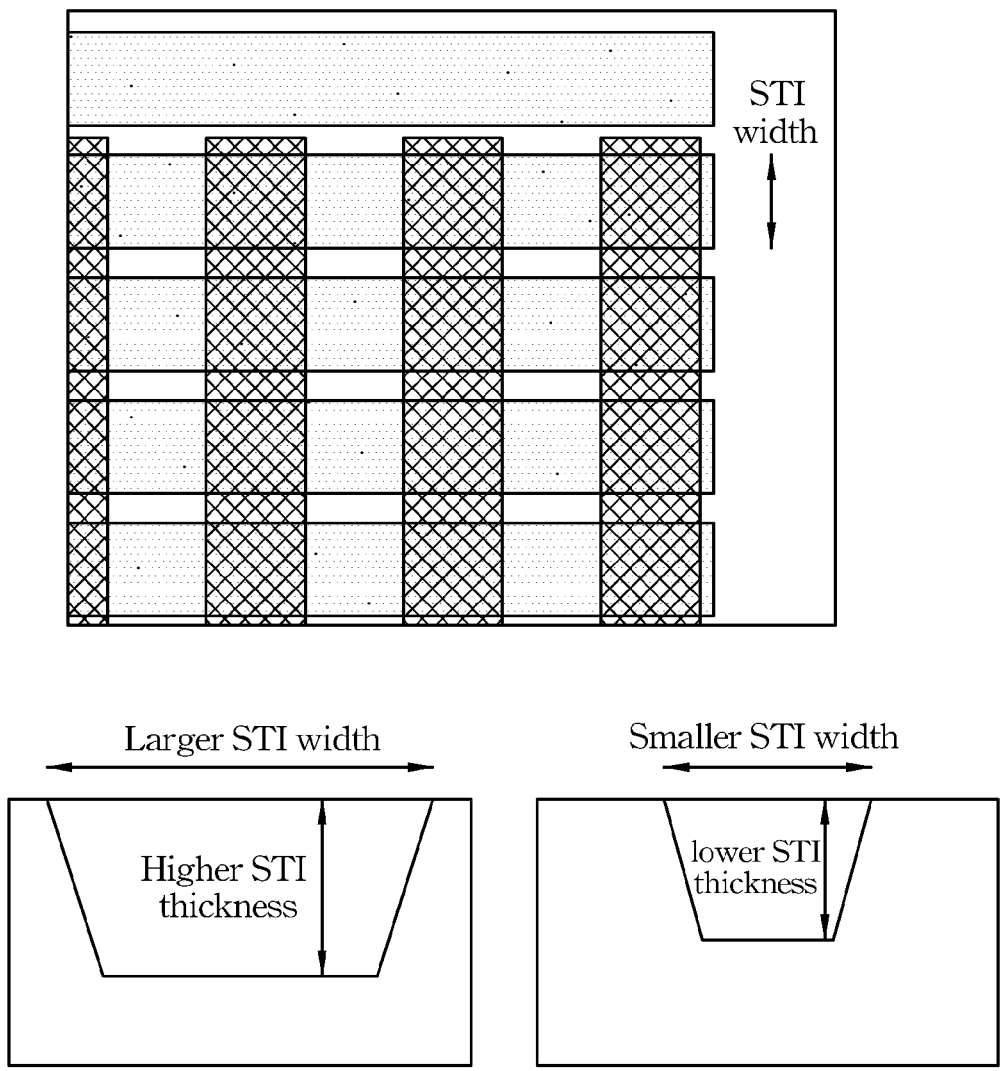
FIG. 3 illustrates a relationship between a width and depth of a shallow trench isolation feature ("STI") used to implement a portion of the alignment structure of FIG. 2.

As illustrated in FIG. 3, due to the inherent characteristics of the etch process used to form STI features, the D of the STI feature is directly related to the width ("W") thereof in a certain range; therefore, the alignment mark structure comprises the poly gate 204 in L2 and the STI feature 208 with an optimized W in L1.

The alignment mark is formed in L2 and is disposed in a special area reserved for the alignment mark. Each field of the wafer 200 may have an alignment mark. In one embodiment, D is related to W by a formula as D=c*W, where c is a constant determined by the characteristics of the etch process to used to form the shallow trenches. In another embodiment, D is designed to be related to lambda (λ), which is the wavelength of an alignment light used with the alignment mark. For example, D may be expressed using the following formula:

$$D = \left(\frac{n}{2}\lambda - \frac{H1}{\sqrt{1-\frac{\sin^2\theta}{n_1^2}}}\right) \times \sqrt{1-\frac{\sin^2\theta}{n_2^2}}$$

where H1 is the height of the poly gate feature 204, $n_1$ is a refractive index of the dielectric material of the STI feature 208, $n_2$ is the refractive index of an interlayer dielectric (ILD) layer 209 surrounding the poly gate feature 204, θ is an incident angle of the alignment light, and n is a positive integer, such as 1 or 2. In one embodiment, the STI feature 208 and the ILD layer 209 both include silicon oxide. In this case, n1 and n2 are the refractive index of the silicon oxide.

In operation, the wafer 200 is loaded onto a stepper 220 comprising a laser beam 222 and an inspector 224. The laser beam is used to project light onto the features 204, 208, to generate the reflective lights 206, 212. The inspector 224 receives the first and second reflective light 206, 212. The inspector 224 is capable of processing the reflective lights 206, 212, to determine an alignment signal therefrom. The stepper 220 utilizes the alignment signal to align the wafer 200 with a mask comprising a pattern to be transferred to a layer L3 of the wafer.

Figure 4:
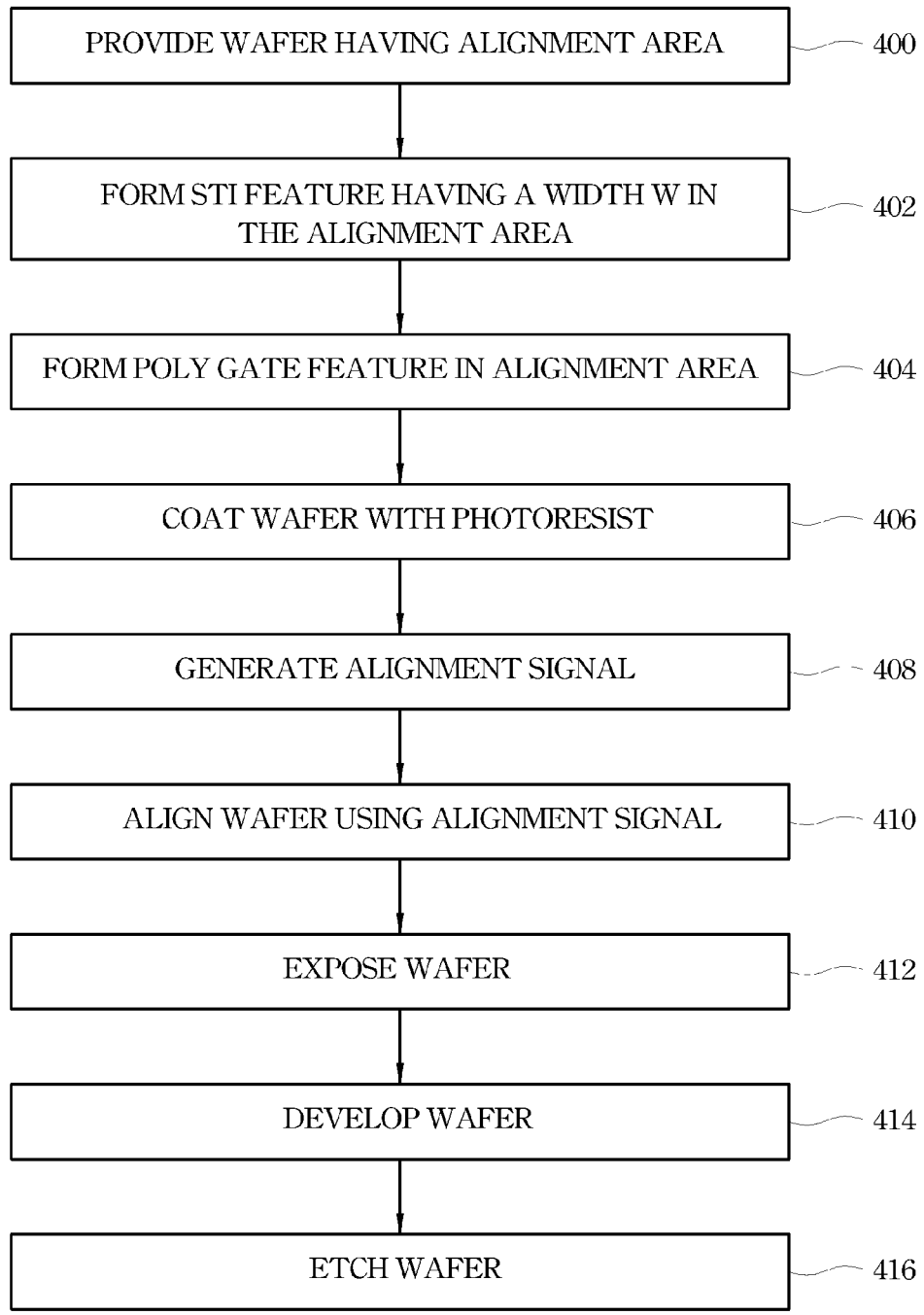
FIG. 4 illustrates a flowchart of fabrication of a wafer comprising the alignment structure of FIG. 2.

Referring now to FIG. 4, in a first step 400, a wafer having an alignment area is provided. In step 402, an STI feature having a width W is formed in the alignment area. In step 404, a poly gate feature is formed in the alignment area. In step 406, the wafer is coated with photoresist ("PR"). In step 408, light from the laser beam of the stepper is reflected off of the floor of the STI feature created in step 402 and the top of the poly gate feature created in step 404 and collected and processed by the inspector of the stepper to create an alignment signal. The formation of the STI feature in step 402 and the poly gate feature in step 404 is accomplished using conventional photolithographic techniques and processes. As noted above, the depth D of the STI feature formed in step 402 is tunable by varying the width W thereof. In accordance with features of one embodiment, the width W, and hence the depth D, is selected so as to ensure that light reflected off the bottom surface of the STI feature constructively interferes with the light reflected off of the poly gate feature (step 408) so as to maximize the strength of the alignment signal detected by the inspector. In step 410, the alignment signal is used to align a mask comprising a contact pattern with the wafer. In step 412, the PR-coated wafer is exposed through the mask. In step 414, the wafer is developed. In step 416, the wafer is etched to form a contact in the contact layer using the developed PR as an etching mask.

Although only a few exemplary embodiments of this invention have been described in detail above, those skilled in the art will readily appreciate that many modifications are possible in the exemplary embodiments without materially departing from the novel teachings and advantages of this invention. In particular, as previously noted, any consecutive layers L1, L2, and L3, may be used to implement the embodiments described herein. In one embodiment, the consecutive layers L1, L2, and L3 are metal I layer, metal II layer, and metal III layer, respectively.

Figure 5:
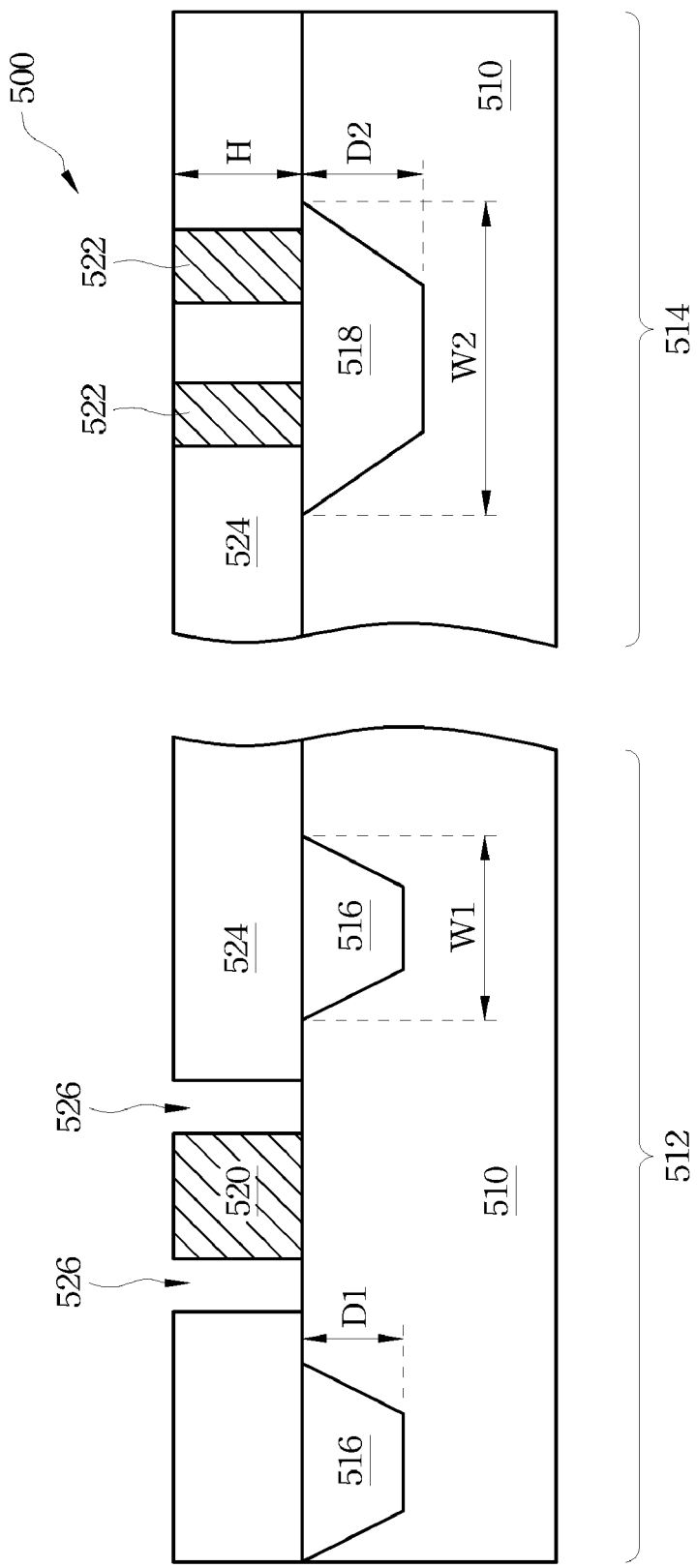
FIG. 5 illustrates another embodiment of a sectional view of a semiconductor structure having an alignment mark constructed according to various aspects of the present disclosure.

FIG. 5 illustrates another embodiment of a sectional view of a semiconductor structure 500 having an alignment mark constructed according to various aspects of the present disclosure. The semiconductor structure 500 includes a semiconductor substrate 510, such as a wafer. The semiconductor substrate 510 includes silicon. Alternatively, the substrate includes germanium, silicon germanium or other proper semiconductor materials. The semiconductor substrate 510 includes a region 512 (device region) for various devices, such as field-effect transistors (FETs), and a region 514 (alignment region) designed for an alignment mark used for mask alignment or overlay alignment. In one embodiment, each lithography exposure field includes one such alignment mark. The semiconductor substrate 510 also includes various doped regions, such as n-well, p-well, light doped drain (LDD) regions, and source/drain (S/D) regions.

The semiconductor substrate 510 includes various isolation features such as shallow trench isolation (STI) features formed in the substrate to separate various devices in the regions 512. STI features are also formed in the region 514 for enhanced alignment and other integration purpose. It is understood that the regions 512 and 514 may each include any number of STI features. For the sake of simplicity and illustration, two of such STI features 516 are shown in the region 512, and one of such STI feature 518 is shown in the region 514 herein. The STI features 516 have a height (or depth) D1 while the STI feature 518 has a depth D2 that may be different from D1.

The semiconductor structure 500 also includes a gate layer formed on the semiconductor substrate 510. The gate layer includes one or more gate stacks 520 in the region 512 and one or more gates stacks 522 in the region 514. The gate layer further includes an interlayer dielectric (ILD) layer 524 filled in the gaps between adjacent gate stacks. In the region 512, the gate stack 520 is formed on an active region of the semiconductor substrate 510 to be functional as a component of an integrated circuit. For example, the gate stack 520 is a functional gate of the associated field-effect transistor. The gate stacks 522 in the region 514 are positioned over the STI feature 518 and implemented to serve as portions of an alignment mark. The gate stacks 522 may be positioned directly above the STI feature 518.

In one embodiment, the alignment mark includes a plurality of gate stacks configured as a grating structure for alignment. In another embodiment, the alignment mark includes a gate stack designed in a box structure for alignment using a box-in-box (BIB) technique. The gate stacks 522 are positioned on the STI features 518 to enhance the alignment signal with a configuration described below in more detail.

The depth D2 is designed such that a first alignment light reflected from a top surface of the gate stacks 522 of the alignment mark and a second alignment light reflected from a bottom surface of the STI 518 constructively interfere with each other to enhance the alignment signal during an alignment operation. In one embodiment, D2 is greater than D1. In another embodiment, D2 is designed to be related with lambda ($\lambda$), the wavelength of an alignment light used during an alignment operation, by a formula as $$D2 = \left(\frac{n}{2}\lambda - \frac{H}{\sqrt{1 - \frac{\sin^2\theta}{n_1^2}}}\right) \times \sqrt{1 - \frac{\sin^2\theta}{n_2^2}}$$

where H is the height of the gate stacks 522 and $n_1$ is the refractive index of the dielectric material of the STI feature 518, $n_2$ is the refractive index of the ILD layer 524, $\theta$ is incident angle of the alignment light, and n is a positive integer, such as 1 or 2.

The formation of STI features includes etching a trench in a substrate and filling the trench by one or more insulating materials such as silicon oxide, silicon nitride, or silicon oxynitride. The filled trench may have a multi-layer structure such as a thermal oxide liner layer with CVD silicon oxide filling the trench. In one embodiment, the STI feature is created using a process sequence such as: growing a pad oxide, forming a low pressure chemical vapor deposition (LPCVD) silicon nitride layer, patterning an STI opening using photoresist and masking, etching a trench in the substrate, optionally growing a thermal oxide trench liner to improve the trench interface, filling the trench with CVD oxide, using chemical mechanical planarization (CMP) to etch back, and using a nitride stripping method to remove the silicon nitride.

In one embodiment, the STI features 516 and 518 are formed simultaneously by the same etching procedure. Due to characteristics of the etch process, in a certain range, the depth of an etched trench is related to the width of the etched trench. Therefore, a patterned material layer is first formed on the semiconductor substrate 510, defining one or more first openings in the region 512 and one or more second openings in the region 514. The first openings have a width W1 and the second openings have a width W2 different from W1. D1 and D2 are related to W1 and W2, respectively, by the characteristics of the etch process to form the various STI trenches. In one embodiment, D2 is related to W2 by a formula as D2=c*W2, where c is a constant determined by the characteristics of the etch process to used to form the STI feature 518.

Then the etch process is applied to the substrate 510, forming a first trench having the depth D1 in the region 512 and a second trench of the depth D2 in the second region 514. Then one or more dielectric materials are filled in the various trenches, thereby forming the STI features 516 and 518. In this case, the STI features 516 in the region 512 include a top width equal to W1, and the STI feature 518 in the region 514 includes a top width equal to W2 but different from W1.

In an alternative embodiment, the trenches for the STI features 516 and the trenches for the STI features 518 are formed separately by respective lithography patterning and etch processes. For example, a first etch process is applied to the region 512 through an etch mask to form the trenches for the STI features 516 while the region 514 is protected by the etch mask. A first photomask is used in this process to form the associated etch mask defining various openings. Thereafter, a second etch process is applied to the region 514 through a second etch mask to form the trenches for the STI features 518 while the region 512 is protected by the second etch mask. A second photomask is used in this process to form the associated etch mask defining various openings. The first etch process is tuned to form the corresponding trenches with a depth equal to D2.

The gate stack 520 in the region 512 includes a high k dielectric material layer and one or more metal layers disposed on the high k dielectric layer. The gate stacks 522 in the region 514 include a silicon oxide layer and a polysilicon layer on the silicon oxide layer. For example, a dielectric material is formed on the substrate, and a polycrystalline silicon (polysilicon) layer is then formed on the dielectric material layer. The dielectric material layer and polysilicon layer are patterned to form dummy polysilicon gate stacks in the region 512 and the gate stacks 522 in the region 514 by a procedure including lithography patterning and etching. Then the polysilicon layer portions of the dummy polysilicon gate stacks in the second region 512 are replaced by one or more metal layers in a gate-last procedure. In more detail, in the gate-last procedure, the polysilicon layer in the dummy polysilicon gate is removed by an etch process, resulting in gate trenches. The gate trenches are further filled through metal deposition. A polishing process, such as chemical mechanic polishing (CMP), is additionally applied to remove the excessive metal(s). The dielectric material layer includes an interfacial layer (such as silicon oxide), high k dielectric material or combination thereof. If the dielectric material layer includes only silicon oxide layer, then the high k metal gate (HKMG) stack 520 is formed by a high k last procedure where both a high k dielectric material layer and metal layer(s) are formed to fill the gate trenches.

In an alternative embodiment, the gate stack 520 and the gate stacks 522 both include the high k dielectric layer and one or more metal layers on the high dielectric layer, formed by a same gate-last procedure or high k last procedure discussed above. In other words, the gate stacks 520 and 522 are all high k metal gates.

Referring back to FIG. 5, in the gate stack 520, the high-k dielectric layer includes a dielectric material having the dielectric constant higher than that of thermal silicon oxide, which is about 3.9. In one example, the high-k dielectric layer includes hafnium oxide (HfO). In various examples, the high-k dielectric layer includes metal oxide, metal nitride, or combinations thereof. In one embodiment, the gate material layers include multi-layer dielectric materials, such as an interfacial layer (e.g., silicon oxide) and a high k dielectric material layer disposed on the interfacial layer.

The interfacial layer may be formed by methods such as chemical oxide technique, thermal oxide procedure, atomic layer deposition (ALD) or chemical vapor deposition (CVD). The high k dielectric material layer may be formed by CVD, ALD, plasma enhanced CVD (PE CVD), or plasma enhanced ALD (PEALD). The polysilicon layer can be formed using CVD with precursor silane (SiH4). The metal layer in the gate stack 520 includes a metal, such as aluminum or tungsten. In another embodiment, the gate stack 520 additionally includes a second metal layer interposed between the first metal layer (aluminum or tungsten) and the high k dielectric material layer.

The second metal layer is chosen to have a proper work function to reduce the threshold voltage of the associated field-effect transistor(s). For example, an n-type FET include an n-type work function metal (n metal) and a p-type FET include a p-type work function metal (p metal). An n metal is a metal having a first work function such that the threshold voltage of the associated nFET is reduced. The n metal has a work function close to the silicon conduction band energy (Ec) or lower work function. For example, the n metal has a work function of about 4.2 eV or less. A p metal is a metal having a second work function such that the threshold voltage of the associated pFET is reduced. The p metal has a work function close to the silicon valence band energy (Ev) or higher work function. For example, the p metal has a work function of about 5.2 eV or greater.

One embodiment of the gate-last procedure is further described in more detail. The gate materials including the dielectric material layer and polysilicon layer are formed on the substrate and are patterned to form polysilicon gate stacks. The patterning of the gate material layers can be achieved by a lithography process and an etch process. The gate material layers are further etched using a patterned photoresist layer, thereby forming the various gate stacks in the regions 512 and 514. The patterned photoresist layer is removed thereafter using a suitable process, such as wet stripping or plasma ashing. Then the interlayer dielectric layer 524 is formed on the substrate and a polishing process, such as CMP, is applied to the substrate to remove the excessive ILD layer and planarize the surface. In the subsequent process, the polysilicon gate stack 520 in the region 512 is replaced by the metal layer(s). The gate stacks 522 in the region 514 remain as the polysilicon structure or are alternatively replaced by the metal layer(s) through the same procedure.

The alignment mark having the gate stacks 522 are used to align the mask for forming contact holes, such as contact holes 526, in the ILD layer 524. As one example, a photoresist layer is coated on the substrate, then alignment light is projected on the substrate for mask alignment using the alignment mark. Then a photolithography exposure process is applied to the photoresist layer using the aligned mask having a contact pattern. Other lithography processes (such as post exposure baking, developing, and hard baking) and an etch process are followed to form the contact holes 526 in the ILD layer 524.

The alignment mark and the method of making the same are described. Various embodiments, alternatives and modifications may exist without departure from the present disclosure. For example, the polysilicon layer in the gate stacks 522 may be alternatively an amorphous silicon layer. In another example, a patterned photoresist layer is used in various patterning processes and is formed using a photolithography process including photoresist coating, soft baking, exposing, post-exposure baking (PEB), developing, and hard baking. An etch process is applied to the underlying material layer(s) using the patterned photoresist layer as an etch mask. The patterned photoresist layer is removed thereafter by wet stripping or plasma ashing. Alternatively, a patterned hard mask layer, such as silicon nitride, may be used as an etch mask.

In one embodiment, the device region 512 may additionally include some dummy gates formed on the STI features 516 for integration purpose (such as uniform CMP effect) and performance enhancement (such as uniform device characteristics). The STI feature 518 in the alignment region 514 is configured to enhance the alignment signal associated with the overlying alignment mark that includes the gate stacks 522. As such, the STI feature 518 is also referred to as an alignment enhancing feature. Similar alignment structures can be formed in other consecutive layers, referred to as layer L1, layer L2 that is formed on the layer L1, and layer L3 that is formed on the layer L2.

In one embodiment, the alignment enhancing feature is formed in the layer L1, the alignment mark is formed in the layer L2 and is disposed on (or above) the alignment enhancing feature. The alignment mark can be used for aligning a photomask having a predefined pattern for the layer L3. The alignment enhancing feature is designed to have a proper height (or depth) such that a first reflective light reflected from a bottom of the alignment enhancing feature and a second reflective light reflected from a top of the alignment mark constructively interfere with each other to enhance the alignment signal. In another embodiment, the consecutive layers L1/L2/L3 can be any three consecutive layers of STI, gate, contact, metal I, via I, metal II, via II, and etc.

In one embodiment, a semiconductor structure includes a substrate having a device region and an alignment region; a first shallow trench isolation (STI) feature in the alignment region and having a first depth D1; a second STI feature in the device region and having a second depth D2; an alignment mark with patterned features overlying the first STI in the alignment region; and a gate stack formed on an active region in the device region.

Another embodiment of a semiconductor structure a substrate having a device region and an alignment region; a first feature having a first depth D1 in the alignment region; a second feature in the device region and having a second depth D2, wherein the first and second features are formed in the substrate; and a third feature overlying the first feature, configured as an alignment mark, and formed in a material layer on the substrate.

The present disclosure also provides an embodiment of a method including providing a wafer; forming a first feature having a first depth D1 wherein the first feature is formed in a layer L1 of the wafer; forming a second feature in the layer L1 and having a second depth D2; forming a third feature comprising an alignment mark, wherein the third feature is formed in a layer L2 of the wafer and overlying the first feature; coating the wafer with photoresist ("PR"); and aligning a mask to the wafer in accordance with an alignment signal comprising a first reflective light reflected from a bottom of the first feature and a second reflective light reflected from a top of the second feature; wherein the depth D1 of the first feature is such that the first reflective light constructively interferes with the second reflective light.

Another embodiment is a method including forming, on a semiconductor substrate, a patterned material layer having a first opening in a first region and a second opening in a second region, wherein the first opening has a first width W1 and the second opening has a second width W2 different from W1; performing an etch process to the semiconductor substrate through the openings of the patterned material layer, resulting a first trench of a first depth D1 in the first region and a second trench of a second depth D2 in the second region; filling a dielectric material in the first and second trenches to form a first STI in the first region and a second STI in the second region; and patterning a conductive material layer, resulting an alignment mark on the first STI and a gate stack on an active region of the second region.

It is understood that various different combinations of the above-listed embodiments and steps can be used in various sequences or in parallel, and there is no particular step that is critical or required. Furthermore, features illustrated and discussed above with respect to some embodiments can be combined with features illustrated and discussed above with respect to other embodiments. Accordingly, all such modifications are intended to be included within the scope of this invention.

What is claimed is:

1. A semiconductor structure comprising:
a substrate having a device region and an alignment region, the device region having an active region;
a first shallow trench isolation (STI) feature disposed in the alignment region, the first STI feature having a first depth D1;
a second STI feature disposed in the device region, the second STI feature having a second depth D2 that is different from the first depth D1;
an alignment mark having patterned features overlying the first STI in the alignment region; and
a gate stack disposed on the active region of the device region,
wherein the first depth D1 of the first STI is such that a first reflective alignment signal from a bottom surface of the first STI feature constructively interferes with a second reflective alignment signal from a top surface of the alignment mark.

2. The semiconductor structure of claim 1, wherein the first depth D1 is related to a wavelength ($\lambda$) of an alignment light used with the alignment mark by a formula, $$D1 = \left(\frac{n}{2}\lambda - \frac{H}{\sqrt{1 - \frac{\sin^2\theta}{n_1^2}}}\right) \times \sqrt{1 - \frac{\sin^2\theta}{n_2^2}}$$

wherein H is a height of the alignment mark, $n_1$ is a refractive index of a dielectric material of the first STI feature, $n_2$ is a refractive index of an interlayer dielectric material adjacent the gate stack, $\theta$ is incident angle of the alignment light, and n is a positive integer.

3. The semiconductor structure of claim 1, wherein
D1 is greater than D2;
the first STI feature includes a first width W1; and
the second STI feature includes a second width W2 that is less than W1.

4. The semiconductor structure of claim 1, wherein:
the alignment mark includes a silicon oxide layer and a polysilicon layer disposed on the silicon oxide layer; and
the gate stack includes a high k dielectric material layer and a metal layer disposed on the high k dielectric material layer.

5. The semiconductor structure of claim 1, wherein the alignment mark and the gate stack each include a high k dielectric material layer and a metal layer disposed on the high k dielectric material layer.

6. The semiconductor structure of claim 1, wherein the patterned features of the alignment mark include a periodic structure configured as a grating.

7. A semiconductor structure comprising:
a substrate having a device region and an alignment region;
a first feature having a first depth D1 in the alignment region;
a second feature in the device region and having a second depth D2, wherein the first and second features are formed in the substrate; and
a third feature overlying the first feature, configured as an alignment mark, and formed in a material layer on the substrate,
wherein the first depth D1 has a value such that a first reflective alignment signal from a top surface of the third feature constructively interferes with a second reflective alignment signal from a bottom surface of the first feature.

8. The semiconductor structure of claim 7, wherein the first and second features are shallow trench isolation ("STI") features; and
wherein the third feature includes a gate stack.

9. The semiconductor structure of claim 8, wherein the gate stack includes one of polysilicon and amorphous silicon.

10. The semiconductor structure of claim 8, wherein the gate stack includes a metal layer.

11. The semiconductor structure of claim 7, wherein the material layer further includes a plurality of gate stacks disposed on active regions of the substrate in the device region, the plurality of gate stacks including a high k dielectric material layer and a metal layer on the high k dielectric material layer.

12. The semiconductor structure of claim 7, wherein the first and second features are formed in a lower metal layer; and the third feature is formed in an upper metal layer that is positioned above the lower metal layer.

13. The semiconductor structure of claim 7, wherein the third feature includes a grating structure configured to provide alignment signal.

14. The semiconductor structure of claim 7, wherein the first feature includes a square structure configured for alignment.

15. A method comprising:
forming, on a semiconductor substrate, a patterned material layer having a first opening in a first region and a second opening in a second region, wherein the first opening has a first width W1 and the second opening has a second width W2 different from W1;
performing an etch process to the semiconductor substrate through the openings of the patterned material layer, resulting a first trench of a first depth D1 in the first region and a second trench of a second depth D2 in the second region;
filling a dielectric material in the first and second trenches to form a first shallow trench isolation (STI) feature in the first region and a second STI feature in the second region; and
patterning a conductive material layer to form an alignment mark on the first STI feature and a gate stack on an active region of the second region; and
replacing a first material of the gate stack with a second material using a gate-last procedure.

16. The method of claim 15, wherein replacing the first material of the gate stack with the second material using the gate-last procedure includes replacing the first material of the gate stack with a metal material using the gate-last procedure.

17. The method of claim 16, further comprising forming a high k dielectric layer between the metal material and the semiconductor substrate.

18. The method of claim 15, wherein the conductive layer includes polysilicon.

19. The method of claim 15, further comprising
coating the semiconductor substrate with a photoresist ("PR") layer; and
aligning a mask in accordance with an alignment signal having a first reflective light reflected from a bottom of the first STI feature and a second reflective light reflected from a top of the alignment mark, wherein the depth D1 of the first STI feature has a value such that the first reflective light constructively interferes with the second reflective light;
exposing the PR layer through the aligned mask; and
developing the exposed PR layer.

20. The semiconductor structure of claim 1, wherein the first STI feature has a first thickness along the first depth D1 and the second STI feature has a second thickness along the second depth D2, the first thickness being greater than the second thickness.

* * * * *